(12) United States Patent
Chen et al.

(10) Patent No.: US 10,014,441 B2
(45) Date of Patent: *Jul. 3, 2018

(54) LIGHT-EMITTING DEVICE

(71) Applicant: EPISTAR CORPORATION, Hsinchu (TW)

(72) Inventors: Shih-I Chen, Hsinchu (TW); Wei-Yu Chen, Hsinchu (TW); Yi-Ming Chen, Hsinchu (TW); Ching-Pei Lin, Hsinchu (TW); Tsung-Xian Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 20 days.

This patent is subject to a terminal disclaimer.

(21) Appl. No.: 14/579,807

(22) Filed: Dec. 22, 2014

(65) Prior Publication Data

US 2015/0155444 A1 Jun. 4, 2015

Related U.S. Application Data

(63) Continuation of application No. 13/851,997, filed on Mar. 28, 2013, now Pat. No. 8,916,884.

(30) Foreign Application Priority Data

Mar. 30, 2012 (TW) ............................... 101111652 A

(51) Int. Cl.
*H01L 33/00* (2010.01)
*H01L 33/42* (2010.01)
*H01L 33/38* (2010.01)

(52) U.S. Cl.
CPC ............ *H01L 33/42* (2013.01); *H01L 33/382* (2013.01); *H01L 2924/0002* (2013.01)

(58) Field of Classification Search
CPC ......... H01L 33/40; H01L 33/08; H01L 33/10; H01L 33/18; H01L 33/24; H01L 33/26;
(Continued)

(56) References Cited

U.S. PATENT DOCUMENTS 6,657,236 B1 * 12/2003 Thibeault ................ H01L 33/20
257/81
7,285,801 B2 10/2007 Eliashevich et al.
(Continued)

FOREIGN PATENT DOCUMENTS

CN 102244173 A 11/2011
TW 200702825 A 1/2007
(Continued)

*Primary Examiner* — Su C Kim
(74) *Attorney, Agent, or Firm* — Patterson + Sheridan, LLP

(57) ABSTRACT

Disclosed is a light-emitting device comprising a light-emitting stack having a length, a width, a first conductivity type semiconductor layer, an active layer on the first conductivity type semiconductor layer, and a second conductivity type semiconductor layer on the active layer, wherein the first conductivity type semiconductor layer, the active layer, and the second conductivity type semiconductor layer are stacked in a stacking direction. A first electrode is coupled to the first conductivity type semiconductor layer and extended in a direction parallel to the stacking direction and a second electrode is coupled to the second conductivity type semiconductor layer and extended in a direction parallel to the stacking direction. A dielectric layer is disposed between the first electrode and the second electrode.

10 Claims, 13 Drawing Sheets

(58) Field of Classification Search
CPC ....... H01L 33/36; H01L 25/075; H01L 33/42;
H01L 33/38; H01L 2924/0002; H01L
25/167; H05B 33/0803; H05B 33/0896;
H05B 33/10; F21K 9/00; G02F 1/133603
USPC .............................. 257/9–39, 79–103, 915,
257/E51.018–E51.022, E33.001–E33.077,
257/E33.054, E25.028, E25.032, E39,
257/E51.038–E51.04, E23.074, E23.165,
257/E29.069–E29.071, E29.245,
257/E49.001–E49.004; 438/22–47, 69,
438/493, 503, 507, 775–777, 956, 962
See application file for complete search history.

(56) References Cited

U.S. PATENT DOCUMENTS

| | | | | |
|---|---|---|---|---|
| 2004/0266044 | A1* | 12/2004 | Park | H01L 33/42 438/46 |
| 2007/0200119 | A1* | 8/2007 | Li | H01L 33/08 257/79 |
| 2008/0308832 | A1* | 12/2008 | Hsieh | H01L 33/44 257/98 |
| 2010/0276706 | A1* | 11/2010 | Herrmann | H01L 33/0079 257/89 |
| 2011/0042698 | A1* | 2/2011 | Chan | C09K 11/7731 257/91 |
| 2011/0049224 | A1* | 3/2011 | Ashe | B65D 27/34 229/68.1 |
| 2011/0140078 | A1* | 6/2011 | Hsu | H01L 25/0753 257/13 |
| 2011/0163346 | A1* | 7/2011 | Seo | H01L 33/08 257/99 |
| 2011/0272712 | A1* | 11/2011 | Jeong | H01L 27/156 257/79 |
| 2012/0018750 | A1 | 1/2012 | Wang et al. | |
| 2012/0032214 | A1* | 2/2012 | Ito | H01L 33/42 257/98 |

FOREIGN PATENT DOCUMENTS

| | | |
|---|---|---|
| TW | 200849655 A | 12/2008 |
| TW | 201145589 A | 12/2011 |

* cited by examiner

US 10,014,441 B2

LIGHT-EMITTING DEVICE

CROSS REFERENCE TO RELATED APPLICATION

This application is a continuation application of U.S. patent application Ser. No. 13/851,997, entitled "LIGHT-EMITTING DEVICE", filed on Mar. 28, 2013, now U.S. Pat. No. 8,916,884 issued Dec. 23, 2014, which claims priority to Taiwan Patent Document No. 101111652, filed on Mar. 30, 2012 with the Taiwan Patent Office, which disclosures are hereby incorporated by reference in their entireties.

TECHNICAL FIELD

The application relates to a light-emitting device, and more particular to a light-emitting device with an enhanced light extraction.

DESCRIPTION OF BACKGROUND ART

FIGS. 1A and 1B show the schematic diagrams of a known light-emitting diode. FIG. 1A is the top view, and FIG. 1B is the cross-sectional view. For a known light-emitting diode, a light-emitting stack 101 is formed on the substrate 111. The light-emitting stack 101 comprises a first conductivity type semiconductor layer 101a, an active layer 101b, and a second conductivity type semiconductor layer 101c The first conductivity type semiconductor layer 101a and the second conductivity type semiconductor layer 101c are of different conductivity type. For example, the first conductivity type semiconductor layer 101a is an n-type semiconductor layer, and the second conductivity type semiconductor layer 101c is a p-type semiconductor layer. A first electrode 104 and a second electrode 105 are disposed on the first conductivity type semiconductor layer 101a and the second conductivity type semiconductor layer 101c respectively to conduct the electric current. In addition, a transparent conductive layer 103 is disposed on the second conductivity type semiconductor layer 101c as an ohmic contact layer. Metal and a transparent conductive material can be applied to the light-emitting diode as an ohmic contact material at present. However, metal has the advantage of good current conducting while it has the disadvantage of light absorbing. And the transparent conductive material has an advantage of light transmittance while it is inferior to the metal in the current conducting. Currently, most of the solutions are using the transparent conductive layer 103 for ohmic contact together with the metal lines as the extending electrodes 105a to conduct the electric current. The design of adopting the metal lines as the extending electrodes 105a provides good current conducting but increases the shielding because of the metal material, which results in a loss of light intensity.

SUMMARY OF THE DISCLOSURE

Disclosed is a light-emitting device comprising a light-emitting stack having a length, a width, a first conductivity type semiconductor layer, an active layer on the first conductivity type semiconductor layer, and a second conductivity type semiconductor layer on the active layer, wherein the first conductivity type semiconductor layer, the active layer, and the second conductivity type semiconductor layer are stacked in a stacking direction. A first electrode is coupled to the first conductivity type semiconductor layer and extended in a direction parallel to the stacking direction and a second electrode is coupled to the second conductivity type semiconductor layer and extended in a direction parallel to the stacking direction. A dielectric layer is disposed between the first electrode and the second electrode.

DETAILED DESCRIPTION OF PREFERRED EMBODIMENTS

Figure 1A:
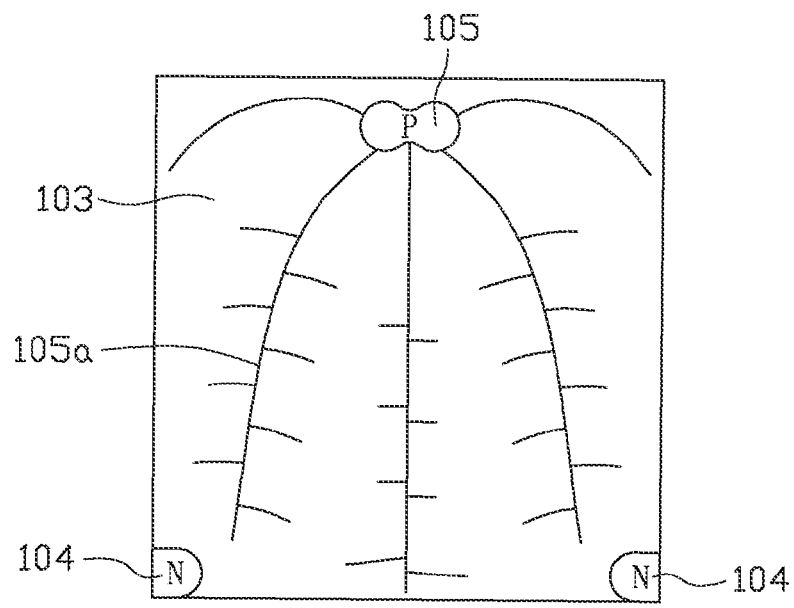
FIG. 1A illustrates the top view of the light-emitting diode known in the prior art.
Figure 1B:
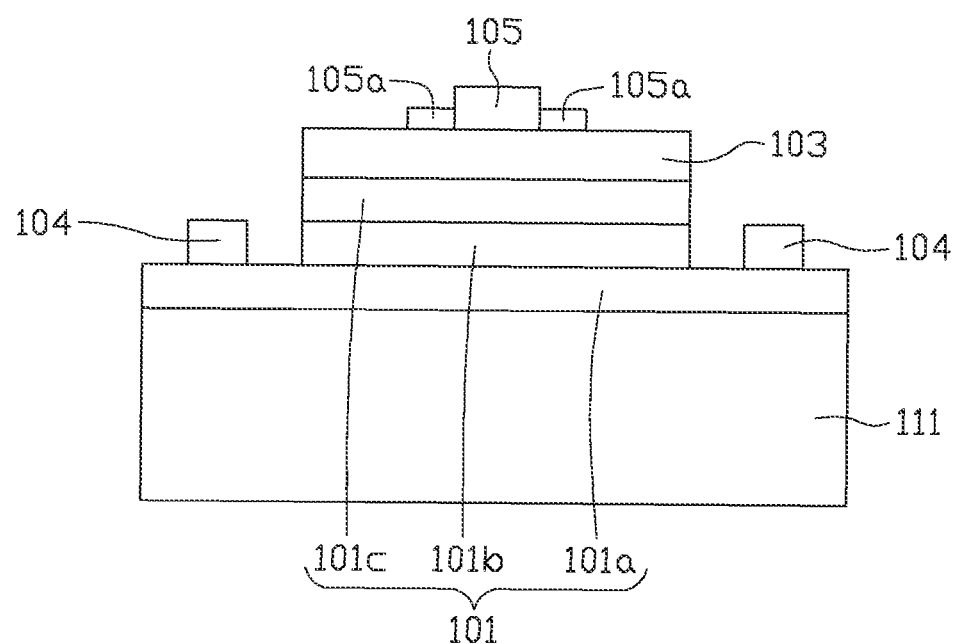
FIG. 1B illustrates the cross-sectional view of the light-emitting diode known in the prior art.

FIG. 2 shows the first embodiment of the present application. As shown in FIG. 2A, a first light-emitting stack 201 is firstly formed on a substrate 211, wherein the first light-emitting stack 201 comprises a first conductivity type semiconductor layer 201a, an active layer 201b, and a second conductivity type semiconductor layer 201c from the bottom to the top. The first conductivity type semiconductor layer 201a and the second conductivity type semiconductor layer 201c are of different conductivity type. For example, the first conductivity type semiconductor layer 201a is an n-type semiconductor layer, and the second conductivity type semiconductor layer 201c is a p-type semiconductor layer. Then a part of light-emitting stack 201 is taken off to be used for following processes by a method, for example, the Epitaxy Lift-Off (ELO) method. As shown in FIG. 2A, firstly, the separating lines 213 and 213' are formed between the part to be taken off (part C) and the adjacent remaining parts (part L and part R) respectively by laser cutting or a method of lithography and etching to facilitate the following lift-off step. Then a temporary substrate 212, such as glass, is provided to be bonded to the part C to be taken off. The bonding method may be forming a bonding material (not shown) at the bonding interface 215 (shown in FIG. 2B), and the temporary substrate 212 and the substrate 211 are heated and pressurized for bonding. The bonding material may be a conductive material or a non-conductive material. The conductive material comprises metal or metal alloy, such as gold, silver, and tin, or alloy thereof. The non-conductive material comprises polyimide (PI), benzocyclobutene (BCB), perfluorocyclobutane (PFCB), epoxy resin (Epoxy), and other organic bonding material. The bonding method is well known in this field of the art so the details are not illustrated. After the bonding step, as shown in FIG. 2B, a laser irradiation 214 is employed at the interface of the part C to be used and the substrate 211, and at the same time the part C to be used is lifted upward through its bonding to the temporary substrate 212 and is taken off. As shown in FIG. 2B, the taken-off light-emitting stack 201 has a length L and a width W, and the x-axis illustrated in the figure is parallel to the length L, while the y-axis is parallel to the width W.

Figure 2A:
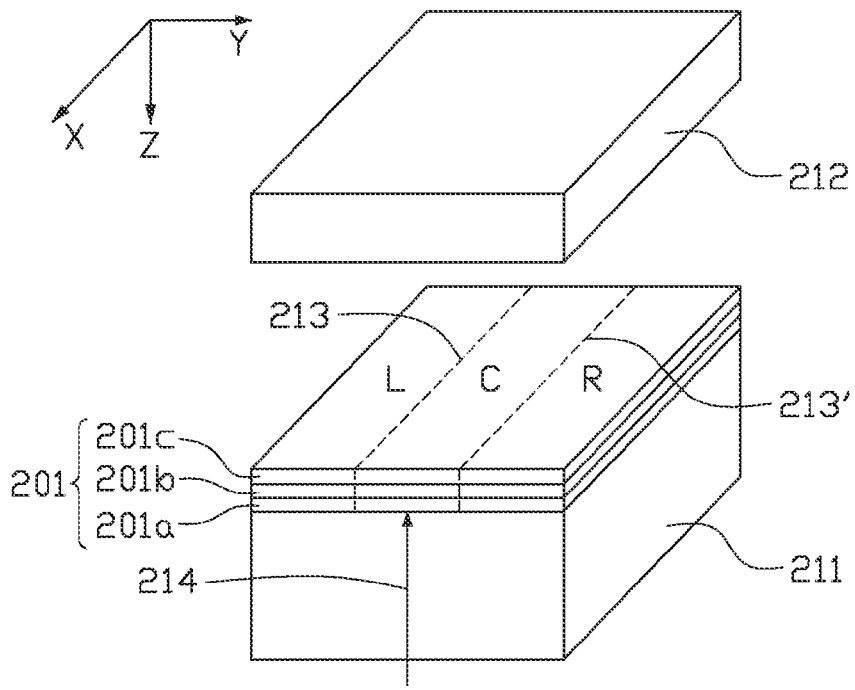
FIGS. 2A to 2F illustrate the forming method and the structure of the light-emitting diode in accordance with first embodiment of the present application.
Figure 2B:
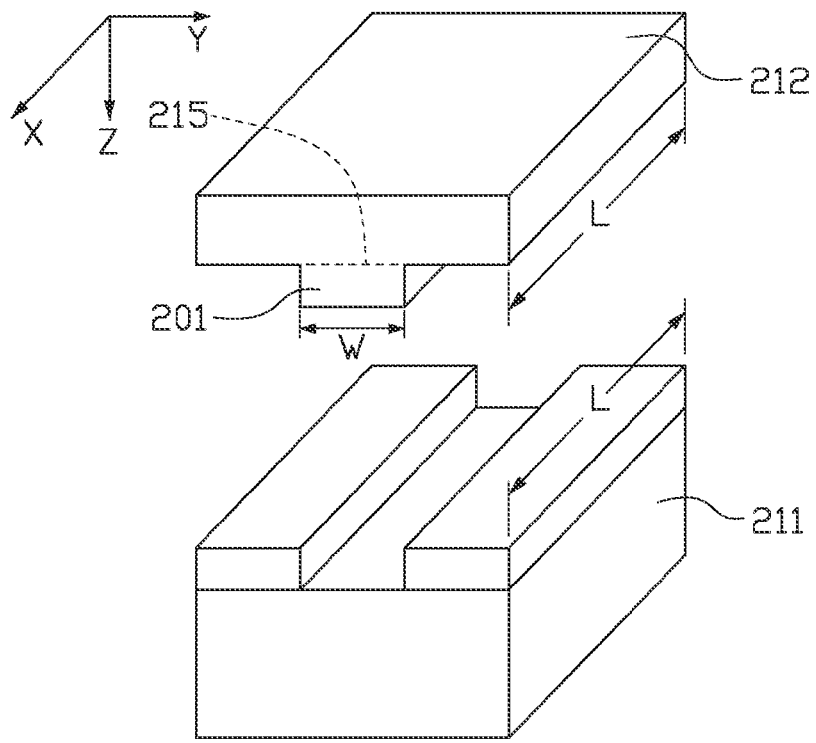
Figure 2C:
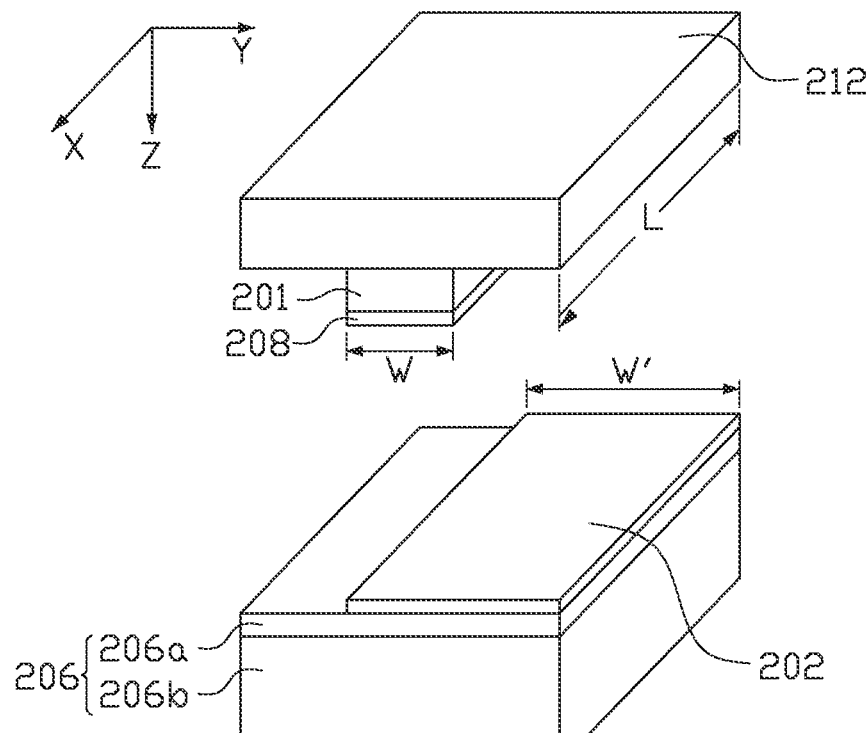
Figure 2D:
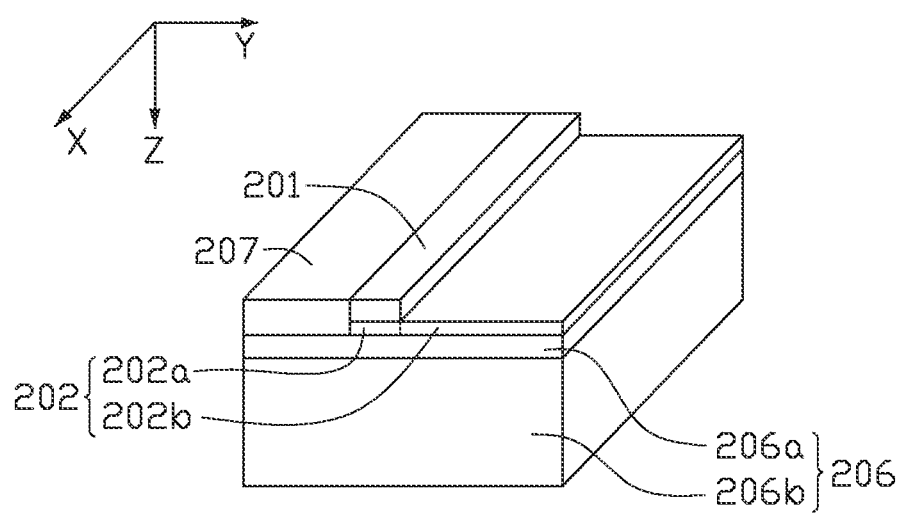

Then, as shown in FIG. 2C, a permanent substrate 206 is provided. The permanent substrate 206 may be a conductive substrate or a non-conductive substrate. The conductive substrate may be a substrate of a semiconductor material (such as silicon), silicon carbide, or metal. The non-conductive substrate may be, for example, a substrate of sapphire ($Al_2O_3$), glass, or ceramic material. A silicon (Si) substrate 206b, which is commonly used in the industry, is used in the present embodiment. Because a horizontal structure is illustrated in the present embodiment, a dielectric layer 206a, such as silicon oxide, is firstly formed on the Si substrate 206b to form the permanent substrate 206 in the present embodiment. A conductive layer 202 is subsequently formed on the permanent substrate 206, and the width W' of the conductive layer 202 is larger than the width W of the aforementioned taken-off light-emitting stack 201. The conductive layer 202 may be metal material, metal oxide, or a stack of both. The metal material may be indium (In), gold (Au), titanium (Ti), platinum (Pt), aluminum (Al), or silver (Ag), or the metal alloy of the above metal materials, or the stack of the above metal materials. The metal oxide may be indium tin oxide (ITO). And then the taken-off light-emitting stack 201 is bonded to the conductive layer 202. For example, a bonding layer 208 is firstly formed on the light-emitting stack 201, and then the taken-off light-emitting stack 201 is bonded to the conductive layer 202 through the bonding layer 208. In one embodiment, the bonding layer 208 comprises indium tin oxide (ITO), and the conductive layer 202 is a stack of titanium (Ti)/gold (Au)/silver (Ag)/indium tin oxide (ITO). In addition, the bonding layer 208 may comprise a reflective metal to act as a reflecting mirror at the same time. One example is that a stack of silver (Ag)/titanium (Ti)/platinum (Pt)/gold (Au) is formed on the light-emitting stack 201 as the bonding layer 208, and the conductive layer 202 is a stack of titanium (Ti)/gold (Au)/indium (In) from the bottom to the top. Similarly, bonding can be done through heating and pressuring. And as the laser irradiation method illustrated above, by employing a laser irradiating at the interface of the light-emitting stack 201 and the temporary substrate 212, the temporary substrate 212 is removed. As shown in FIG. 2D, the conductive layer 202 is under the light-emitting stack 201, or more specifically, under the first conductivity type semiconductor layer 201a thereof (not shown in this figure, please refer to FIG. 2A). Since the width W' of the conductive layer 202 is larger than the width W of the light-emitting stack 201, the conductive layer 202 can be deemed to be composed of a first overlapping portion 202a and a first extending portion 202b, wherein the first overlapping portion 202a overlaps the first conductivity type semiconductor layer 201a while the first extending portion 202b does not overlap the first conductivity type semiconductor layer 201a. The first extending portion 202b extends in a first direction (+y direction) which is in parallel to the width direction. Next, as shown in the figure, a dielectric layer 207 is formed at the sidewalls of the light-emitting stack 201 and the conductive layer 202 by processes such as a Chemical Vapor Deposition (CVD) method or an Electron-Gun (E-gun) method along with processes such as a method of lithography and etching or a photoresist Lift-Off method. The material of the dielectric layer 207 may be silicon oxide ($SiO_2$), silicon nitride ($SiN_x$), or aluminum oxide ($Al_2O_3$).

Figure 2E:
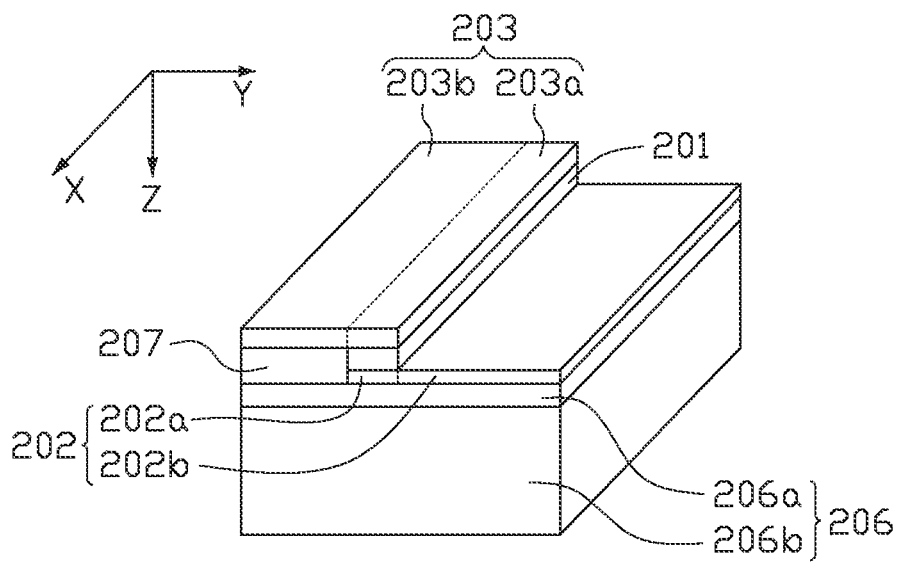
Figure 2F:
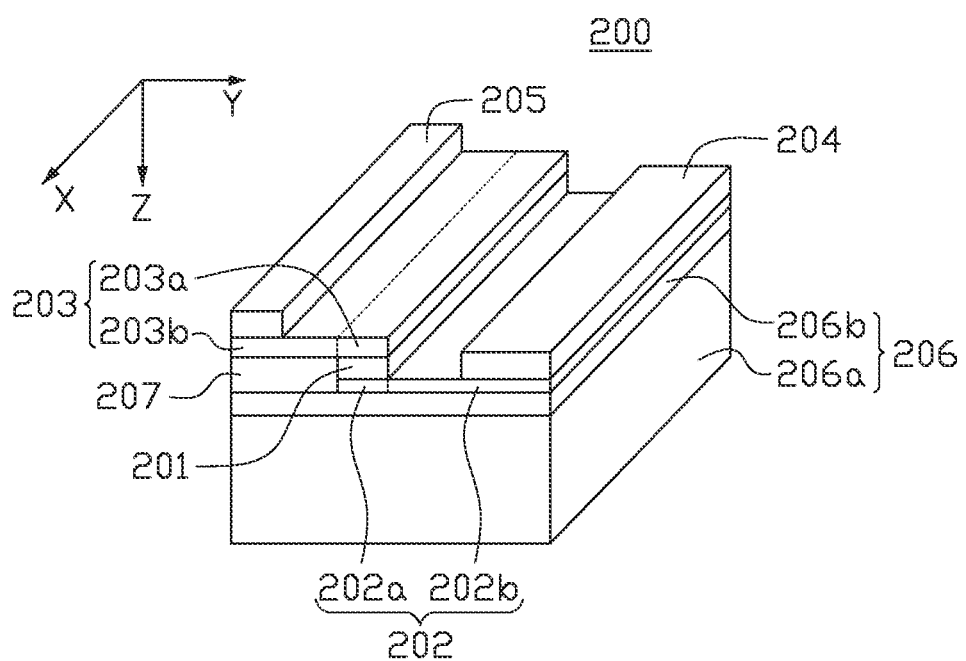

Next, as shown in FIG. 2E, a transparent conductive layer 203 is formed on the light-emitting stack 201, or more specifically, on the second conductivity type semiconductor layer 201c thereof (not shown in this figure, please refer to FIG. 2A). Similarly, since the transparent conductive layer 203 comprises a width larger than the width of the second conductivity type semiconductor layer 201c, the transparent conductive layer 203 can be deemed to be composed of a second overlapping portion 203a and a second extending portion 203b, wherein the second overlapping portion 203a overlaps the second conductivity type semiconductor layer 201c while the second extending portion 203b does not overlap the second conductivity type semiconductor layer 201c, and the second extending portion 203b extends in a second direction (−y direction) which is in parallel to the width direction, and the second direction (−y direction) is opposite to the first direction (+y direction). The transparent conductive layer 203 may be metal oxide or a thin metal of a thickness less than 500 Å. Metal oxide may be indium tin oxide (ITO), aluminum zinc oxide (AZO), cadmium tin oxide, antimony tin oxide, zinc oxide (ZnO), indium zinc oxide (IZO), zinc tin oxide (ZTO), or a group comprising the above materials. The thin metal may be aluminum, gold, platinum, zinc, silver, nickel, germanium, indium, or tin, or the metal alloy of the above metal materials. Finally, as shown in FIG. 2F, a first electrode 204 is formed on the first extending portion 202b, and a second electrode 205 is formed on the second extending portion 203b. It is noted that, as shown in the figure, the first electrode 204 is substantially joined with only the first extending portion 202b of the conductive layer 202 or a portion thereof, and the second electrode 205 is substantially joined with only the second extending portion 203b of the transparent conductive layer 203 or a portion thereof. In other words, there is no any part of the second electrode 205 or any commonly known extending electrode disposed on the second overlapping portion 203a, which is the portion of the transparent conductive layer 203 overlapping the second conductivity type semiconductor layer 201c. Therefore, there is no light intensity loss caused by the shielding of the metal material. Accordingly, in the present embodiment, the current conduction into the light-emitting stack 201 in the direction parallel to the width direction of the light-emitting stack 201, i.e., y direction, is done substantially through the second overlapping portion 203a of the transparent conductive layer 203. Taking the transparent conductive layer 203 comprising indium tin oxide as an example, the thickness is generally in a range of from 50 nm to 1 μm. In the case of a thickness of 120 nm which is commonly used, the distance for current conduction (or charge transfer) is about 30 μm to 100 μm (i.e., 0.1 mm). Therefore, the width W of the light-emitting stack 201 can be designed to be about 100 μm (i.e., 0.1 mm) in this embodiment, and for a light-emitting stack having 42 mil*42 mil (or about 1 mm*1 mm, or 1 $mm^2$) area which is common for the commercial specification, the length of the light-emitting stack 201 in this embodiment can be lengthened so as to provide the same light-emitting area. In this way, the current conduction is achieved by using the excellent current conduction characteristic of metal material of the second electrode 205, and then the transparent conductive layer 203 with high transparency conducts current to the light-emitting stack 201. Accordingly, the current is uniformly conducted while the shielding by the metal material of the electrode or extending electrode on the light-emitting area is avoided. The length L of the light-emitting stack 201 can be about 10 mm (1 mm²/0.1 mm=10 mm), and the ratio of the length L to the width W is 10 mm: 0.1 mm, or 100:1. Generally, the thicker the thickness of the indium tin oxide of the transparent conductive layer 203 is, the longer the distance for current conduction is, so the width W can be designed to be larger than the width in the above example. The design parameters, such as the light-emitting area, can also be adjusted. For example, when the light-emitting area is adjusted to be smaller than that in the above example, the length L can be correspondingly designed to a smaller value than the one in the above example. For example, when the width W is enlarged to 2 times of the one in the above example, and the length L is reduced to ¹⁄₁₀ of the one in the above example, a ratio of the length L to the width W of the light-emitting stack 201 greater than about 5:1 can achieve the above purposes.

Figure 3A:
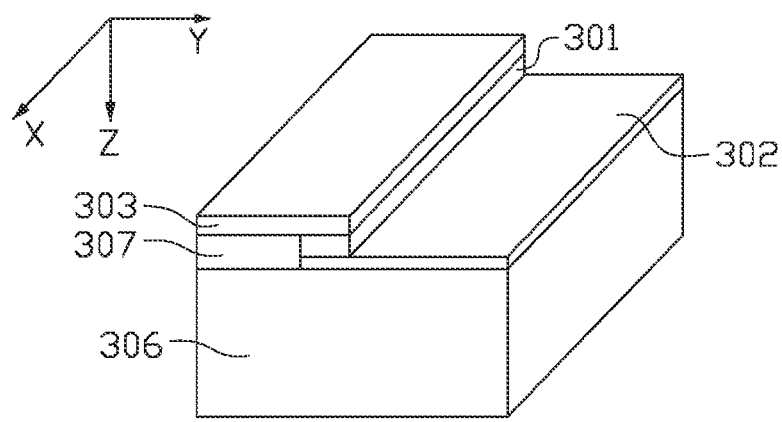
FIGS. 3A to 3E illustrate the forming method and the structure of the light-emitting diode in accordance with second embodiment of the present application.
Figure 3B:
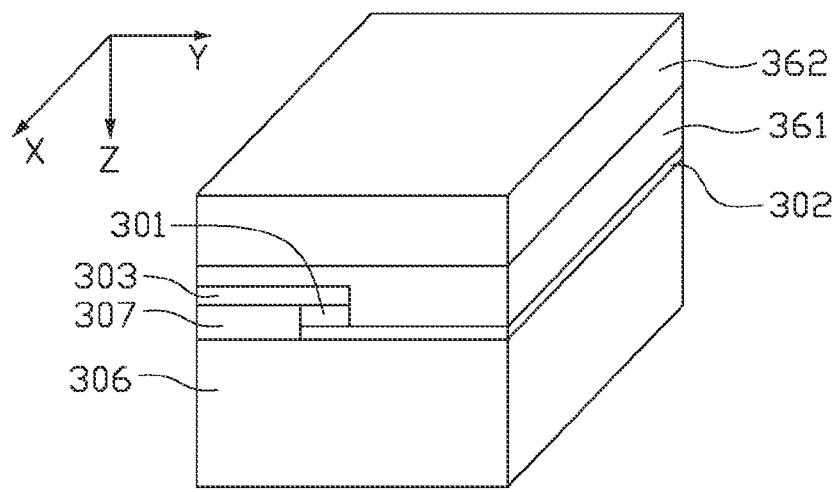
Figure 3C:
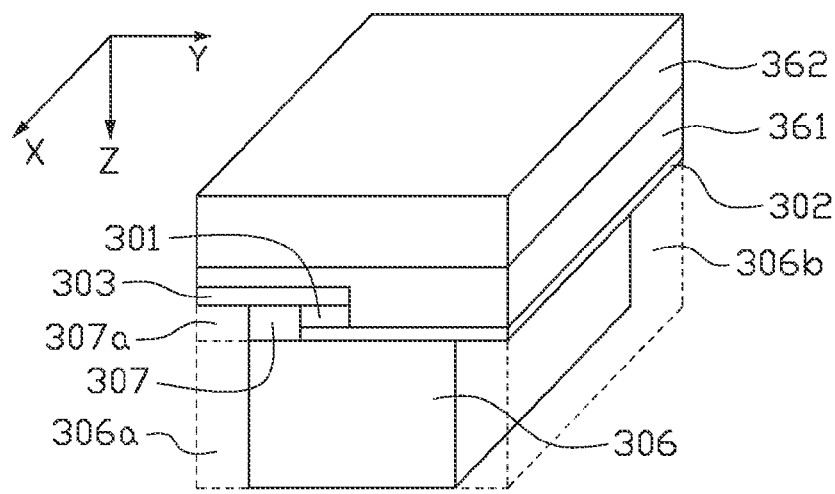
Figure 3D:
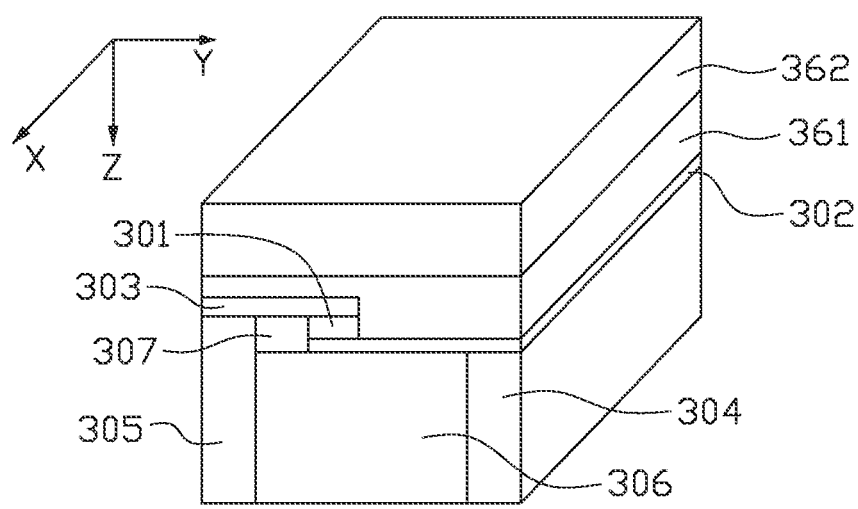
Figure 3E:
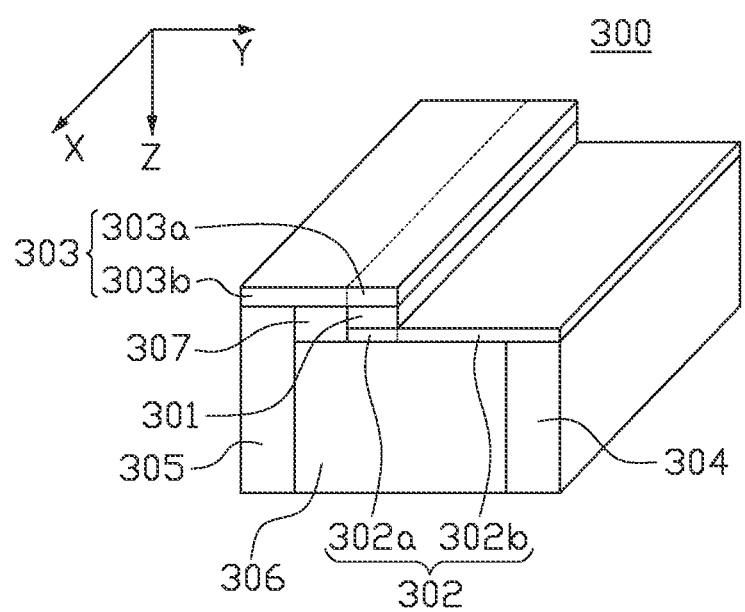

FIGS. 3A to 3E show the second embodiment in the present application. The second embodiment is a modification of the first embodiment above. In the first embodiment, as shown in FIG. 2F, the first electrode 204 is disposed over the first extending portion 202b, and the second electrode 205 is disposed over the second extending portion 203b. In the second embodiment, as shown in FIG. 3E, the first electrode 304 is disposed under the first extending portion 302b, and the second electrode 305 is disposed under the second extending portion 303b. In addition, the permanent substrate 206 composed of the silicon substrate 206a and the dielectric layer 206b thereon in the first embodiment is replaced by glass as the permanent substrate 306 in the second embodiment. Apart from the above, the second embodiment is substantially the same as the first embodiment. Therefore, with the reference to the processes illustrated in FIGS. 2A to 2E in the first embodiment, a structure in FIG. 3A which is similar to FIG. 2E can be obtained. The structure comprises a permanent substrate 306, a conductive layer 302, a light-emitting stack 301, a dielectric layer 307, and the transparent conductive layer 303. Next, as shown in FIG. 3B, the structure in FIG. 3A is bonded to a temporary substrate 362 with a bonding material 361 in order to facilitate the formation of the electrodes in the following steps. And then, as shown in FIG. 3C, by forming a protective layer (not shown), such as a photoresist, on the permanent substrate 306, but exposing the parts 306a, 306b where the electrodes are to be formed, and by using a method of lithography and etching or a sandblasting method, or a combination of both, the parts 306a, 306b of the permanent substrate 306 for forming the electrodes are removed. In addition, the part 307a where the dielectric layer 307 joins the part 306a for forming electrode is also removed. With the above processes, a portion of the conductive layer 302 and a portion of the transparent conductive layer 303 are exposed so that the first electrode 304 and second electrode 305 are formed thereon in the following steps, as shown in FIG. 3D. In some applications, the bonding material 361 and the temporary substrate 362 can be reserved. However, in the present embodiment, the laser irradiation as illustrated previously can be employed to the bonding material 361 or an etching method can be used to remove the bonding material 361 and the temporary substrate 362, and a structure in accordance with the second embodiment is formed as shown in FIG. 3E. Similarly, in the present embodiment, the first electrode 304 joins with only the first extending portion 302b of the conductive layer 302 substantially or a portion of the first extending portion 302b, and the second electrode 305 joins with only the second extending portion 303b of the transparent conductive layer 303 substantially or a portion of the second extending portion 303b. In other words, there is no any part of the second electrode 305 or any extending electrode disposed on the second overlapping portion 303a of the transparent conductive layer 303. And therefore there is no light intensity loss caused by the shielding of the metal material.

Figure 4A:
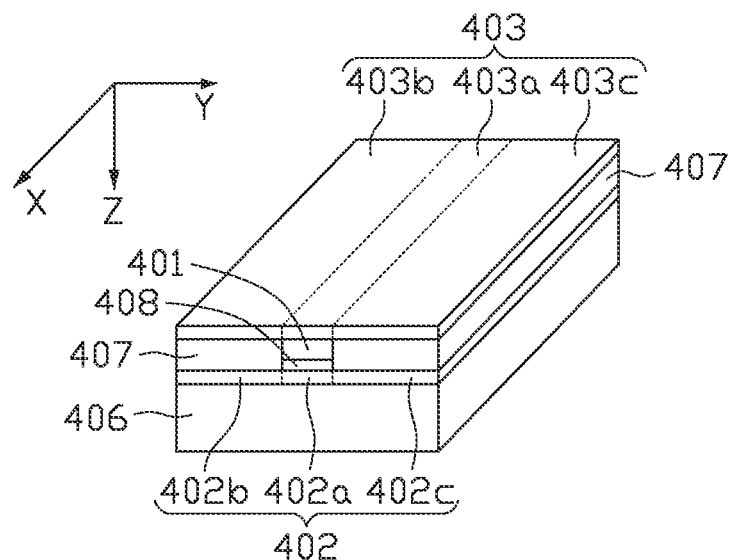
FIGS. 4A to 4D illustrate the forming method and the structure of the light-emitting diode in accordance with third embodiment of the present application.
Figure 4B:
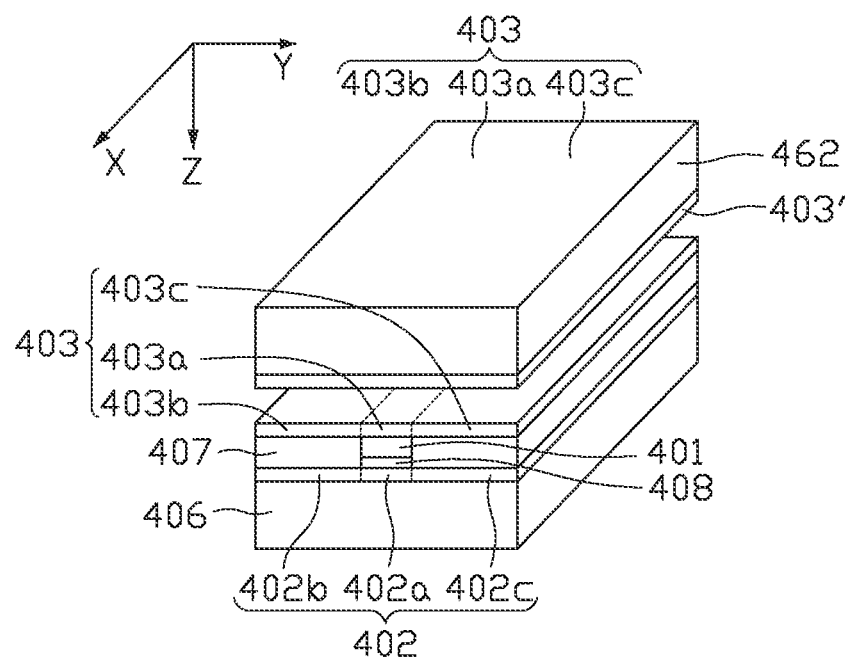
Figure 4C:
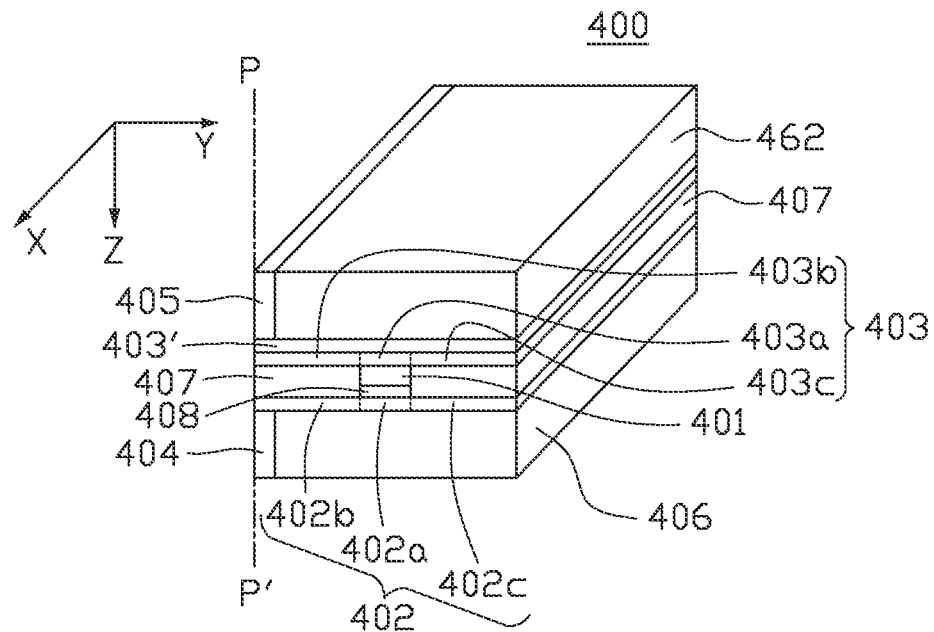

FIGS. 4A to 4D show the third embodiment of the present application. The third embodiment is also a modification of the first embodiment. In the first embodiment, as shown in FIG. 2F, the first electrode 204 is disposed over the first extending portion 202b, and the second electrode 205 is disposed over the second extending portion 203b. In the third embodiment, as shown in FIG. 4C, the first electrode 404 is disposed under the first extending portion 402b, and the second electrode 405 is disposed over the second extending portion 403b. In addition, the permanent substrate 206 composed of the silicon substrate 206b and the dielectric layer 206a thereon in the first embodiment is replaced by a transparent material as the permanent substrate 406 in the third embodiment. The transparent material may be a dielectric material, such as glass. Apart from the above, the third embodiment is substantially the same as the first embodiment. Therefore, with the reference to the processes illustrated in FIGS. 2A to 2E in the first embodiment, a structure in FIG. 4A which is similar to FIG. 2E can be obtained. The structure comprises a permanent substrate 406 comprising glass, a conductive layer 402, a light-emitting stack 401, a dielectric layer 407, and the transparent conductive layer 403. It is noted that since indium tin oxide (ITO) is adopted as the conductive layer 402 of the present embodiment, the method for bonding the conductive layer 402 to the light-emitting stack 401 has been illustrated in the first embodiment. That is, a bonding layer 408, for example, indium tin oxide (ITO) is first formed on the light-emitting stack 401 and then the light-emitting stack 401 is bonded to the conductive layer 402 through the bonding layer 408. It is noted that the conductive layer 402 covers entire light-emitting stack 401, and therefore when compared with the first embodiment, the conductive layer 402 can be deemed to further comprise a third extending portion 402c in addition to the first overlapping portion 402a and the first extending portion 402b. Similarly, the transparent conductive layer 403 can be deemed to further comprise the second overlapping portion 403a, the second extending portion 403b, and a fourth extending portion 403c. And in the present embodiment, the first extending portion 402b and the second extending portion 403b extend in the same direction (−y direction), and the third extending portion 402c and the fourth extending portion 403c extend in the same direction (+y direction).

Next, as shown in FIG. 4B, another transparent material, for example, a transparent substrate 462 of a dielectric material like glass is provided. After a transparent conductive layer 403' formed on the transparent substrate 462, the transparent substrate 462 is bonded to the structure in FIG. 4A. The transparent conductive layer 403' comprising indium tin oxide (ITO) is bonded to the transparent conductive layer 403 which also comprises the indium tin oxide (ITO). Next, as shown in FIG. 4C, by using a method of lithography and etching or a sandblasting method, or a combination of both, a part of the permanent substrate 406 and a part of the transparent substrate 462 are removed to expose a part of the conductive layer 402 and a part of the transparent conductive layer 403'. And then a first electrode 404 is formed under the first extending portion 402b, and a second electrode 405 is formed over the transparent conductive layer 403' to form the completed third embodiment.

Figure 4D:
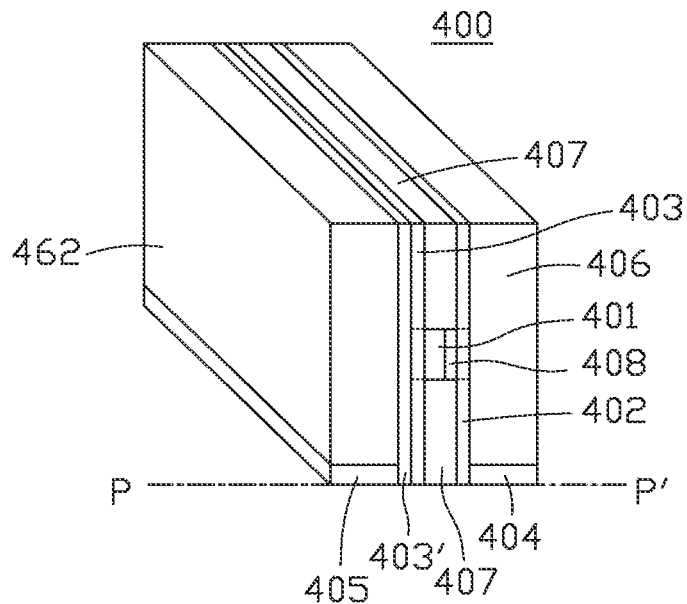

As shown in FIG. 4C, in the third embodiment, the first electrode 404 has a first surface (the one which contacts the PP' plane) which is perpendicular to the first extending portion 402b, and the second electrode 405 has a second surface (the one which contacts the PP' plane) which is perpendicular to the second extending portion 403b. The first surface and second surface are substantially coplanar on the PP' plane. Therefore, the first surface and the second surface can be bonded to a carrier (not shown) having the PP' plane as the carrier surface. In applications, the light-emitting device may be rotated by 90 degrees, as shown in FIG. 4D, so the light emitted by the light-emitting stack 401 is emitted to multiple directions, wherein the permanent substrate 406, the transparent substrate 462, and the dielectric layer 407 are all transparent materials for light extraction. An advantage of Omni-direction lighting is included.

Figure 5:
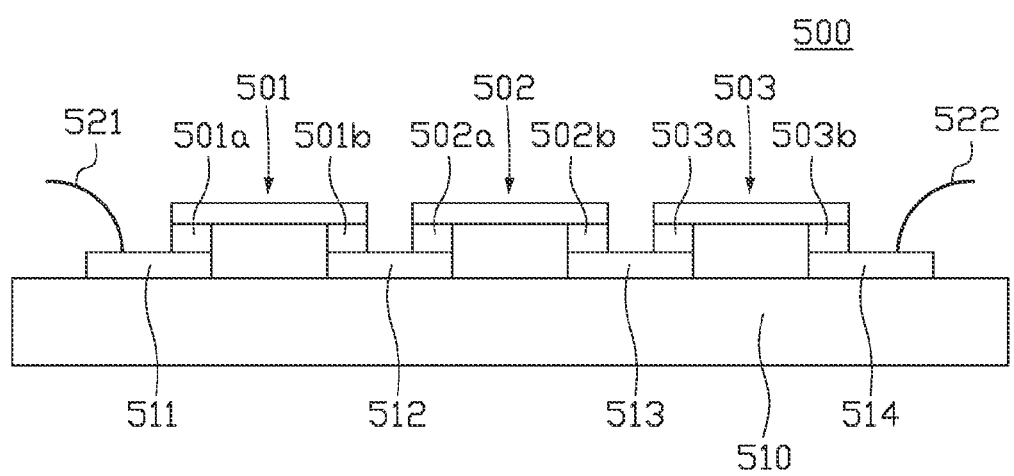
FIG. 5 illustrates a light-emitting apparatus which applies the light-emitting devices in accordance with the embodiments of the present application.

As shown in FIG. 5, the light-emitting devices illustrated in the above three embodiments may be further connected to and combined with other elements to form a light-emitting apparatus 500. The light-emitting apparatus 500 comprises a sub-mount 510 having one circuit 511, 512, 513, 514; and one light-emitting device disposed on the sub-mount 510. There are three light-emitting devices 501, 502, 503 on the sub-mount 510 in the present embodiment, wherein the light-emitting devices 501, 502, 503 may be any one of the light-emitting devices illustrated in the above three embodiments, and the electrodes of the light-emitting devices 501, 502, 503 may be soldered to the circuit 511, 512, 513, 514 of the sub-mount 510 with a solder (not shown). For example, the two electrodes 501a, 501b of the light-emitting device 501 are respectively bonded to the circuit 511, 512; the two electrodes 502a, 502b of the light-emitting device 502 are respectively bonded to the circuit 512, 513; the two electrodes 503a, 503b of the light-emitting device 503 are respectively bonded to the circuit 513, 514. In this way the light-emitting devices 501, 502, 503 may be fixed to the sub-mount 510, and form a serial connection (as the present embodiment shows) or a parallel connection or both serial and parallel connection. And an external power supply is provided to the device 500 through the conductive material structure 521, 522, such as gold wires or copper wires. The sub-mount 510 may be ceramic, glass, glass fiber, or bakelite.

Figure 6A:
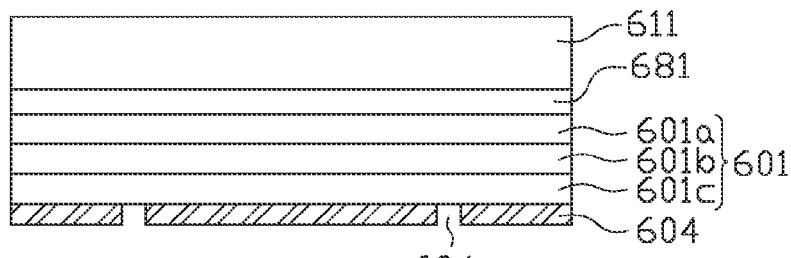
FIGS. 6A to 6I illustrate the forming method and the structure of the light-emitting diode in accordance with fourth embodiment of the present application.
Figure 6B:
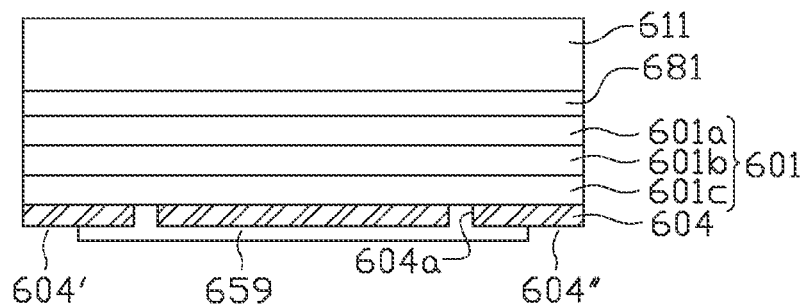
Figure 6C:
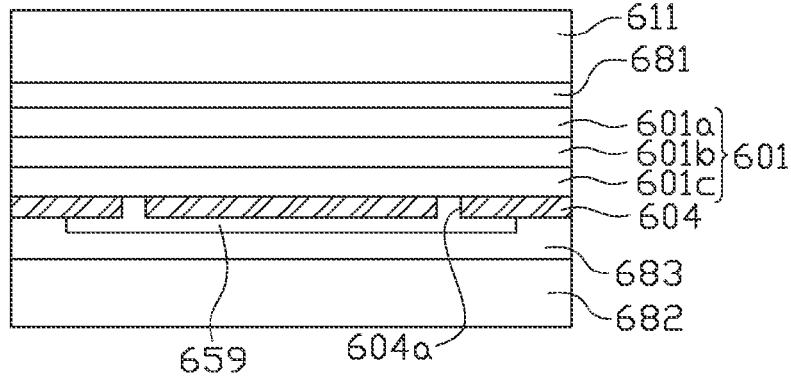
Figure 6D:
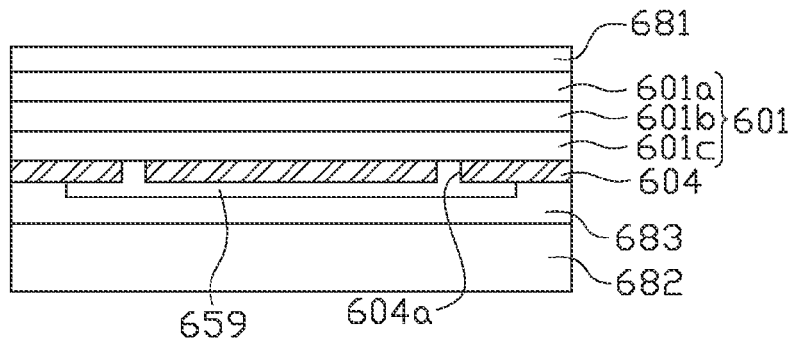

In addition to the above embodiments, it is also possible to make the electrodes and the extending electrode which are set on the light-emitting stack in the prior art substantially not to cover the light-emitting stack by the way of processing, while leaving only a small area for electrical connection so the light-shielding effect is minimized and the metal shading problem is alleviated. Its implementation is illustrated as the fourth embodiment of the present invention shown in FIGS. 6A to 6I. In FIG. 6A, a light-emitting stack 601 comprising a first conductivity type semiconductor layer 601a, an active layer 601b, and second conductivity type semiconductor layer 601c is formed on the substrate 611. Before the light-emitting stack 601 is formed, an intermediate layer structure 681, for example a buffer layer is optionally formed. Then a contact layer 604 is formed on the light-emitting stack 601. The contact layer 604 may be a transparent conductive oxide or a metal; the transparent conductive oxide may be indium tin oxide (ITO), aluminum zinc oxide (AZO), cadmium tin oxide, antimony tin oxide, zinc oxide (ZnO), indium zinc oxide (IZO), or zinc tin oxide (ZTO) or the group composed of these materials; the metal may be aluminum, gold, platinum, zinc, silver, nickel, germanium, indium, tin, beryllium, platinum, or rhodium or the metal alloy of these metal materials. When the metal selected is highly reflective metal, such as aluminum and silver, the metal can function as a reflecting mirror; or a reflection structure (not shown), such as a Distributed Bragg Reflector (DBR) or an Omni-Directional Reflector (ODR) may be alternatively set on the contact layer 604 in order to provide the reflection function. Next, by the method of lithography and etching, portions of the contact layer 604 are removed to form removed contact layer regions 604a. Then, as shown in FIG. 6B, a protective layer 659 is thrilled on the contact layer 604, and the protective layer 659 fills the removed contact layer regions 604a. As the figure shows, two regions of the contact layer 604 which are reserved for electrodes, i.e. the first electrode 604' and the second electrode 604", are not covered by the protective layer 659. As shown in FIG. 6C, the structure in FIG. 6B is bonded to a temporary substrate 682 by a bonding material 683 for the subsequent processes. Next, as the laser irradiation method illustrated previously, a laser (not shown) is employed to irradiate on the interface of the substrate 611 and the intermediate layer structure 681 to remove the substrate 611. The removal of the substrate 611 can also be done by an etching method. The structure after the removal of the substrate 611 is shown in FIG. 6D.

Figure 6E:
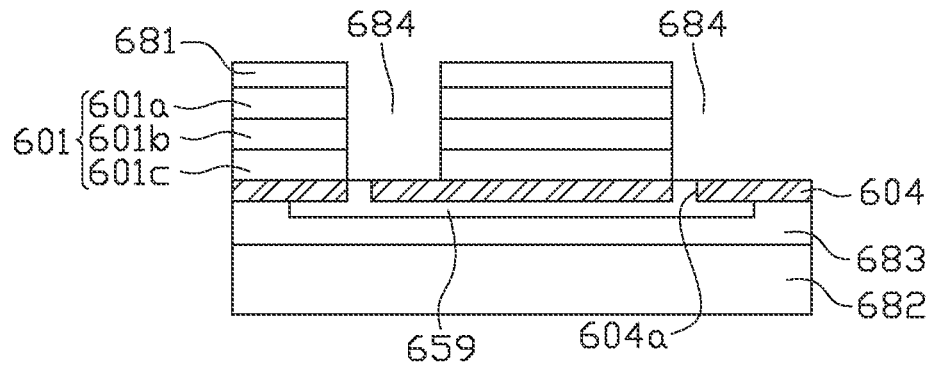
Figure 6F:
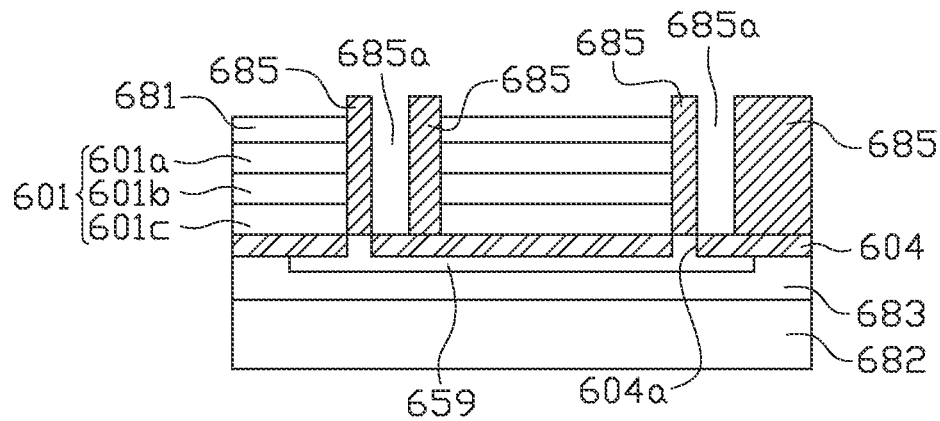
Figure 6G:
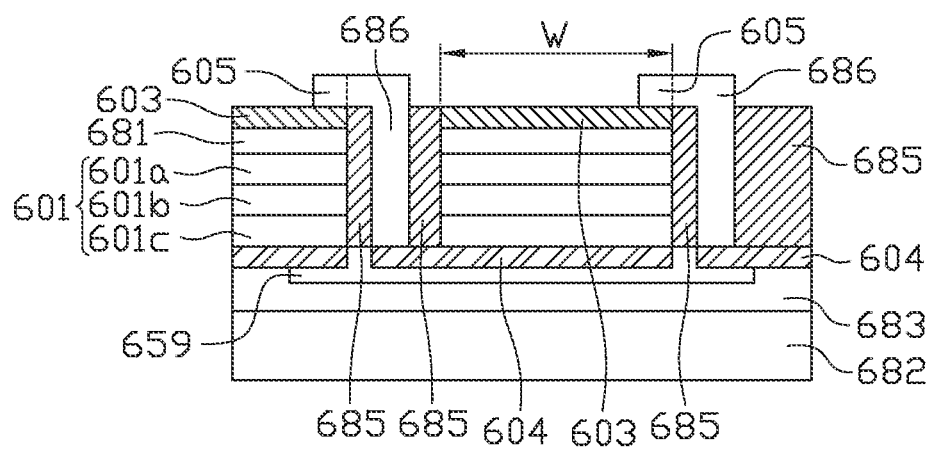
Figure 6H:
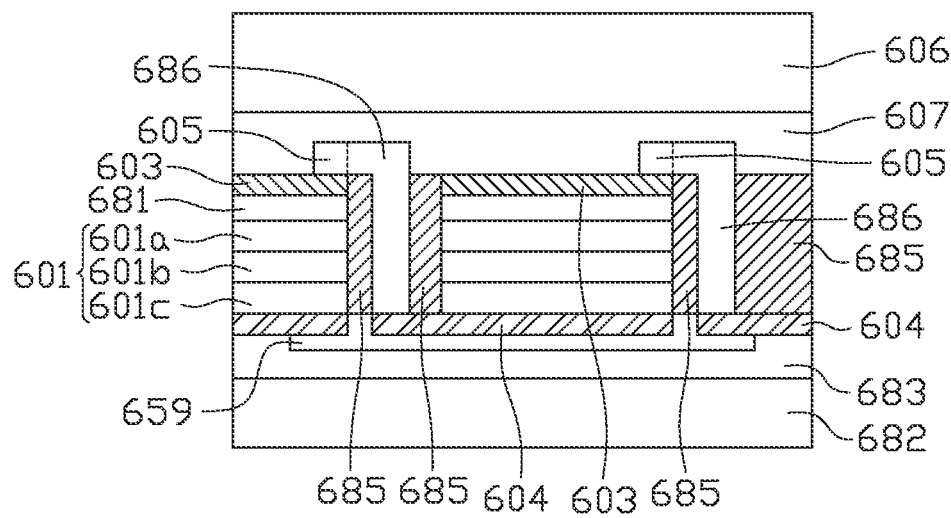
Figure 6I:
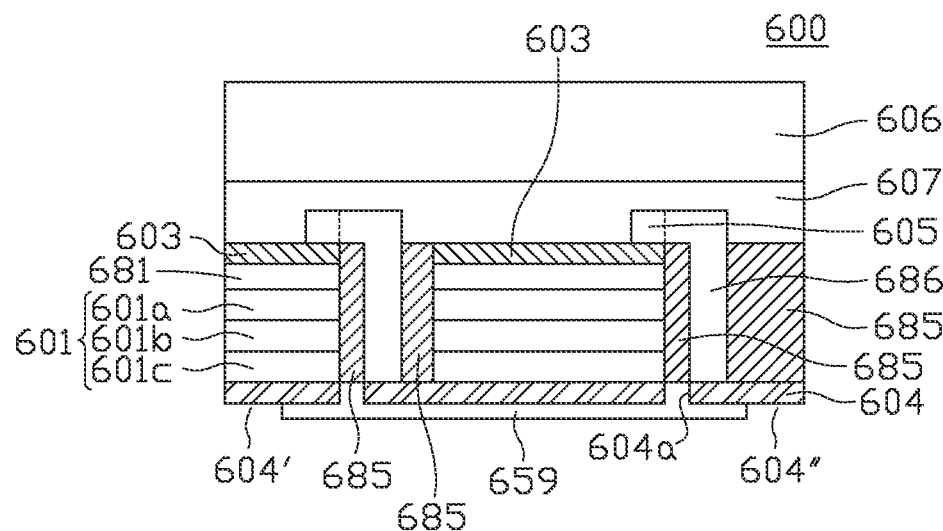
Figure 7:
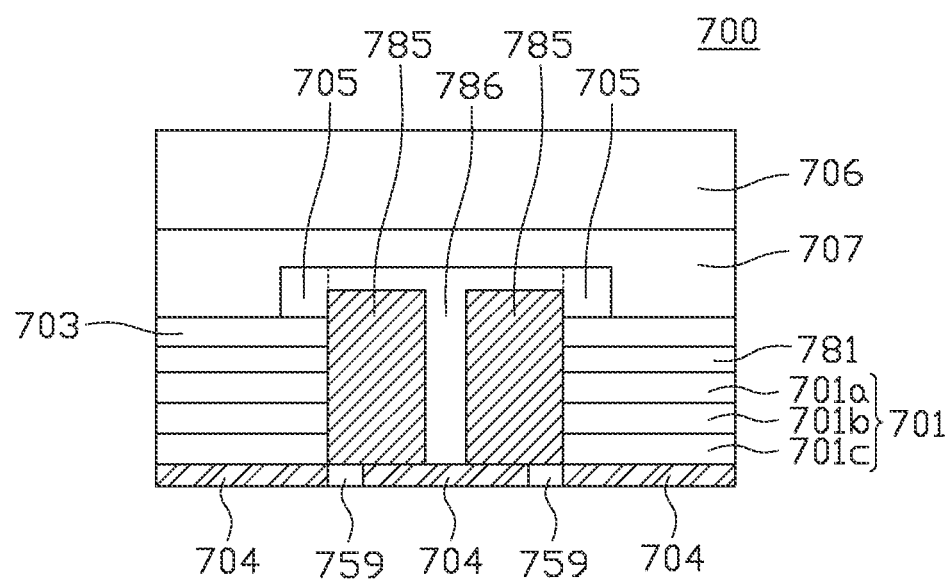
FIG. 7 illustrates the structure of the light-emitting diode in accordance with fifth embodiment of the present application.

As FIG. 6E shows, by the method of lithography and etching, portions of the intermediate layer structure 681 and the light-emitting stack 601 are removed to form isolation areas 684 and expose the contact layer 604 below and the protective layer 659 which fills the removed contact layer regions 604a as illustrated previously. As a result, the whole large area of the light-emitting stack 601 is divided into a plurality of light-emitting units with relatively smaller area. As in the present embodiment shows, the light-emitting stack 601 is divided into two light-emitting units with relatively smaller area; each of which isolated from each other by the isolation area 684. Next, as shown in FIG. 6F, a dielectric layer 685, such as silicon oxide ($SiO_2$), silicon nitride ($SiN_x$), or aluminum oxide ($Al_2O_3$), is formed on the structure of FIG. 6E. And then portions of the dielectric layer 685 is removed by a method of lithography and etching to form electrical connection region 685a and expose the contact layer 604 below (in some circumstances, the aforementioned protective layer 659 which fills the removed contact layer regions 604a may also be exposed). The surface of the intermediate layer structure 681 is also substantially completely exposed to extract the light emitted by the light-emitting stack 601. The light-emitting units are electrically isolated from each other by the dielectric layer 685, and the conductive layer which is filled into the electrical connection region 685a in following steps makes the light-emitting units electrically connected in series, in parallel, or in both series and parallel. As shown in FIG. 6G, a conductive layer 686, such as a metal material like aluminum, gold, platinum, zinc, silver, nickel, germanium, indium, and tin, or the metal alloy of the above metal materials is formed on the structure of FIG. 6F, and then a portion of the conductive layer 686 is removed by lithography and etching to form the aforementioned electrical connection. A serial connection case is shown in the present embodiment. The conductive layer 686 is filled to the electrical connection region 685a and is electrically connected to the exposed contact layer 604 (through one end thereof), while the other end (i.e., 605) of the conductive layer 686 is in contact with a part of the surface of the intermediate layer structure 681. In addition, as shown in FIG. 6G, before the conductive layer 686 is formed, a transparent conductive layer 603 may also be optionally formed on the intermediate layer structure 681, and therefore in the present embodiment the other end (i.e., 605) of the conductive layer 686 is in contact with the surface of the transparent conductive layer 603. As described above, since the large area of the light-emitting stack 601 is divided into a plurality of light-emitting units with relatively smaller area, the width (W) of each light-emitting unit becomes smaller and falls into a distance range for effective current conduction. When the transparent conductive layer 603 exists, no extending electrode is needed for the light-emitting units, and the end (i.e., 605) of the conductive layer 686 which electrically contacts the light-emitting stack 601 can be small so that current is uniformly conducted while the shielding by the metal material of the electrode or extending electrode upon the light-emitting area is avoided. Similarly, a common suitable light-emitting area may be obtained by appropriately determining the aspect ratio of each of the light-emitting units as previous illustration. For example, the aspect ratio may be about greater than 5:1 as illustrated in the aforementioned light-emitting stack. In addition, since this embodiment may be implemented in various types of serial and parallel connection, a light-emitting area for commercial specifications may be obtained by connecting an appropriate number of light-emitting units without adjusting the aspect ratio of each of the light-emitting units. Next, as shown in FIG. 6H, the structure in FIG. 6F is bonded to a transparent substrate 606 comprising a transparent material like glass by a transparent bonding material 607, such as polyimide (PI), benzocyclobutene (BCB), or perfluorocyclobutane (PFCB) and serves as a light extraction surface. Next, as shown in FIG. 6I, the temporary substrate 682 and the bonding material 683 are removed by a method, such as etching, to complete the present embodiment. The connection for the light-emitting units is as described above, and the external power supply can be provided through the aforementioned first electrode 604' and the second electrode 604". The above embodiment illustrates the case of a serial connection, and the fifth embodiment shown in FIG. 7 which illustrates the case of a parallel connection can be obtained by the person of ordinary skill in the art by simply adjusting the processes illustrated in FIGS. 6A to 6I. The adjustments include adjustments of removed contact layer regions 604a in FIG. 6A, adjustments of the formation of isolation area 684 in FIG. 6E, and adjustment of the removal of the conductive layer 686 in FIG. 6G. Accordingly, the first digit of the label code of FIG. 6I is changed from "6" to "7" in FIG. 7. For example, the label code 606 is the transparent substrate 606, so the label code 706 is also a transparent substrate by analogy. However, it is noted that the middle part of the contact layer 704 (i.e., the part of the contact layer 704 which is electrically connected to the first conductivity type semiconductor layer 701a through the conductive layer 786) is the first electrode for the serial connection, and the two side parts of the contact layer 704 (i.e., the parts of the contact layer 704 which are disposed below and electrically connected to the second conductivity type semiconductor layer 701c) are the second electrode for the serial connection (the two side parts of the contact layer 704 can be connected through their top view layout). The two light-emitting units are therefore in parallel connection.

The above-mentioned embodiments are only examples to illustrate the theory of the present invention and its effect, rather than be used to limit the present invention. Other alternatives and modifications may be made by a person of ordinary skill in the art of the present application without escaping the spirit and scope of the application, and are within the scope of the present application.

What is claimed is:
1. A light-emitting device, comprising:
   a light-emitting stack having a length, a width, a first conductivity type semiconductor layer, an active layer on the first conductivity type semiconductor layer, and a second conductivity type semiconductor layer on the active layer, wherein the first conductivity type semiconductor layer, the active layer, and the second conductivity type semiconductor layer are stacked in a stacking direction;
   a first electrode coupled to the first conductivity type semiconductor layer and having a first surface parallel to the stacking direction;
   a second electrode coupled to the second conductivity type semiconductor layer and having a second surface parallel to the stacking direction, wherein the first surface and the second surface are substantially coplanar on a plane, and the plane is substantially parallel to the stacking direction;
   a dielectric layer disposed between the first electrode and the second electrode;
   a conductive layer under the first conductivity type semiconductor layer and having a width greater than the width of the first conductivity type semiconductor layer, wherein the conductive layer comprises a first overlapping portion which overlaps the first conductivity type semiconductor layer and a first extending portion which does not overlap the first conductivity type semiconductor layer; and
   a transparent conductive layer over the second conductivity type semiconductor layer and having a width greater than the width of the light-emitting stack, wherein the transparent conductive layer comprises a second overlapping portion which overlaps the second conductivity type semiconductor layer and a second extending portion which does not overlap the second conductivity type semiconductor layer.

2. The light-emitting device as claimed in claim 1, wherein the first extending portion and the second extending portion extend in a first direction parallel to the width direction of the light-emitting stack.

3. The light-emitting device as claimed in claim 2, wherein the first electrode is disposed directly under the first extending portion, and the second electrode is disposed directly over the second extending portion.

4. The light-emitting device as claimed in claim 3, wherein the first electrode is perpendicular to the first extending portion, and the second electrode is perpendicular to the second extending portion.

5. The light-emitting device as claimed in claim 1, wherein the conductive layer further comprises a third extending portion, the transparent conductive layer further comprises a fourth extending portion, and the third extending portion and the fourth extending portion extend in a second direction parallel to the width direction of the light-emitting stack.

6. The light-emitting device as claimed in claim 4, further comprising a first transparent layer disposed under the conductive layer and joining the first electrode, and a second transparent layer disposed over the transparent conductive layer and joining the second electrode.

7. The light-emitting device as claimed in claim 6, wherein the first transparent layer, the second transparent layer, or both comprise glass.

8. The light-emitting device as claimed in claim 1, wherein the transparent conductive layer comprises metal oxide or a thin metal having a thickness less than 500 Å.

9. The light-emitting device as claimed in claim 8, wherein the metal oxide comprises one material selected from the group consisting of indium tin oxide (ITO), aluminum zinc oxide (AZO), cadmium tin oxide, antimony tin oxide, zinc oxide (ZnO), indium zinc oxide (IZO), and zinc tin oxide (ZTO).

10. The light-emitting device as claimed in claim 8, wherein a thickness of the metal oxide is substantially not larger than 120 nm.

\* \* \* \* \*